United States Patent
Matsumoto et al.

(10) Patent No.: US 8,785,252 B2
(45) Date of Patent: Jul. 22, 2014

(54) RESIN SEALED SEMICONDUCTOR DEVICE AND MANUFACTURING METHOD THEREFOR

(71) Applicants: Masafumi Matsumoto, Tokyo (JP); Tatsuya Iwasa, Tokyo (JP); Junji Yamada, Tokyo (JP); Masaru Furukawa, Fukuoka (JP)

(72) Inventors: Masafumi Matsumoto, Tokyo (JP); Tatsuya Iwasa, Tokyo (JP); Junji Yamada, Tokyo (JP); Masaru Furukawa, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/757,231

(22) Filed: Feb. 1, 2013

(65) Prior Publication Data

US 2013/0143365 A1    Jun. 6, 2013

Related U.S. Application Data

(62) Division of application No. 12/247,515, filed on Oct. 8, 2008, now Pat. No. 8,399,976.

(30) Foreign Application Priority Data

Feb. 27, 2008 (JP) .................................. 2008-046390

(51) Int. Cl.
   *H01L 23/00* (2006.01)
(52) U.S. Cl.
   USPC .......................................... 438/121; 257/690
(58) Field of Classification Search
   USPC .......................................... 257/690; 438/121
   See application file for complete search history.

(56) References Cited

U.S. PATENT DOCUMENTS

| | | | |
|---|---|---|---|
| 3,444,440 A * | 5/1969 | Bell et al. ........................ | 257/666 |
| 3,497,952 A * | 3/1970 | Hood et al. ...................... | 29/876 |
| 3,531,856 A * | 10/1970 | Bell et al. ......................... | 29/827 |
| 4,571,794 A * | 2/1986 | Nakamura .................... | 29/25.35 |
| 4,751,611 A | 6/1988 | Arai et al. | |
| 5,537,342 A | 7/1996 | Gainey | |
| 5,558,795 A * | 9/1996 | Frank ............................. | 219/604 |
| 5,920,119 A | 7/1999 | Tamba et al. | |
| 6,011,303 A | 1/2000 | Tanaka et al. | |
| 6,118,183 A | 9/2000 | Umehara et al. | |
| 2008/0217760 A1* | 9/2008 | Yoshihara et al. ............ | 257/693 |

FOREIGN PATENT DOCUMENTS

| | | |
|---|---|---|
| CN | 101097898 A | 1/2008 |
| DE | 197 19 703 | 11/1998 |
| DE | 10 2007 012 818 A1 | 1/2008 |
| DE | 10 2008 012 703 A1 | 9/2008 |

(Continued)

OTHER PUBLICATIONS

Office Action issued Dec. 27, 2010 in German Application No. 10 2008 050 010 (With English Translation).

(Continued)

*Primary Examiner* — Long K Tran
*Assistant Examiner* — Jordan Klein
(74) *Attorney, Agent, or Firm* — Oblon, Spivak, McClelland, Maier & Neustadt, L.L.P.

(57) ABSTRACT

A semiconductor device includes a thermoplastic resin case, a semiconductor chip mounted within the thermoplastic resin case, a metal terminal having a wire bonding surface and an opposing contact surface, and a wire connected between the wire bonding surface and the semiconductor chip. The contact surface of the metal terminal is thermoplastically bonded at an area to the inside of the thermoplastic resin case.

6 Claims, 6 Drawing Sheets

(56) References Cited

FOREIGN PATENT DOCUMENTS

| EP | 0 150 347 A1 | 8/1985 |
|---|---|---|
| EP | 0 513 410 A1 | 11/1992 |
| JP | 59-8399 | 1/1984 |
| JP | 60-223143 | 11/1985 |
| JP | 62-158389 | 7/1987 |
| JP | 1-243383 | 9/1989 |
| JP | 9-153590 | 6/1997 |
| JP | 10-242338 | 9/1998 |
| JP | 11-74433 | 3/1999 |
| JP | 2000-208655 | 7/2000 |
| JP | 2002-231217 | 8/2002 |
| JP | 2002-291135 | 10/2002 |
| JP | 2003-243610 | 8/2003 |
| JP | 2003-249623 | 9/2003 |
| JP | 2004-87735 | 3/2004 |
| JP | 2004-103936 | 4/2004 |
| JP | 2004-134518 | 4/2004 |
| JP | 2004-179466 | 6/2004 |
| JP | 2005-210006 | 8/2005 |
| JP | 2008-10656 | 1/2008 |
| JP | 2008-252055 | 10/2008 |
| JP | 2009-21286 | 1/2009 |
| WO | WO 00/42656 | 7/2000 |

OTHER PUBLICATIONS

Office Action issued Jun. 29, 2011 in German Patent Application No. 10 2008 050 010.0 (with English translation).
Notice of Reasons for Rejection issued Sep. 27, 2011 in Japanese Patent Application No. 2008-046390 (English translation only).
Office Action issued Sep. 5, 2011, in Chinese Patent Application No. 200810183920.6 (partial English translation only).
Office Action issued Aug. 31, 2012 in German Patent Application No. 10 2008 050 010.0 with English language translation.
Office Action issued Feb. 28, 2014 in Chinese Patent Application No. 200810183920.6 (with Partial English-language Translation), 12 pages.

* cited by examiner

RESIN SEALED SEMICONDUCTOR DEVICE AND MANUFACTURING METHOD THEREFOR

CROSS-REFERENCE TO RELATED APPLICATIONS

This application is a division of and claims the benefit of priority under 35 U.S.C. §120 from U.S. Ser. No. 12/247,515, filed Oct. 8, 2008, the entire contents of which is incorporated herein by reference. U.S. Ser. No. 12/247,515 also claims the benefit of priority under U.S.C. §119 from Japanese Patent Application No. 2008-046390, filed Feb. 27, 2008.

FIELD OF THE INVENTION

The present invention relates to a semiconductor device in which a semiconductor chip is wire bonded to metal terminals mounted on the exterior resin case, and more particularly to a semiconductor device in which such metal terminals are firmly secured to the resin case. The invention also relates to a method for manufacturing such a semiconductor device.

BACKGROUND ART

In the manufacture of semiconductor devices such as power semiconductor devices, it is common to insert (or mount) metal terminals into the exterior resin case at predetermined locations after the case is molded. (The method of inserting metal parts into a resin case, etc. after it is molded is referred to as "outserting.")

The "outserted" metal terminals are wire bonded to the semiconductor chip mounted within the resin case. It should be noted that in order to ensure accurate wire bonding and sufficient bonding strength, it is necessary to secure the metal terminals to the resin case so that they are not displaced from their predetermined positions by the wire bonding operation. Therefore, the resin case has structures thereon for engaging the metal terminals so as to restrict their displacement.

There will now be described, with reference to FIGS. 10 and 11, an exemplary engaging structure that receives therein and engages a metal terminal 100 so as to limit displacement of the terminal (or secure it). Referring to FIG. 10, the metal terminal 100 having a wire bonding surface 108 is inserted into a resin case 102 in the direction indicated by the arrow. More specifically, the metal terminal 100 is inserted between a pair of protrusions 104 (an engaging structure) on the resin case 102. FIG. 11 shows the metal terminal 100 that has been inserted and engaged between the protrusions 104. It should be noted that after the insertion of the metal terminal 100, its wire bonding surface 108 is secured between a pair of wire-bonding-surface holding protrusions 106 on the resin case. Other methods or structures for securing a terminal frame, etc. are disclosed in JP-A Nos. 59-008399 (1984), 62-158389 (1987), 2002-231217, 60-223143 (1985), 2002-291135, 01-243383 (1989).

Accurate wire bonding on a metal terminal requires that the terminal be secured to the resin case, as described above. However, in order to secure the metal terminal to the resin case with sufficient force, it is not enough merely to insert the terminal in place between protrusions on the resin case (as described with reference to FIG. 11). Specifically, as shown FIG. 12, which is a cross-sectional view taken along line 12-12 of FIG. 11, there are gaps A, B, and C between the protrusions 104 and the metal terminal 100, which prevents the metal terminal 100 from being sufficiently secured to the resin case. Further, as shown in FIG. 13, which is a plan view of the view of FIG. 11, there are also gaps D between the metal terminal 100 and the wire-bonding-surface holding protrusions 106, which also serve to prevent securing of the terminal. These gaps A, B, C, and D cannot be eliminated due to process variations.

Refer now to FIG. 14, which is a view of the same cross section as FIG. 12. In order to firmly secure the metal terminal 100 to the resin case (or between the protrusions 104 thereon) 102, an adhesive 110 may be applied to fill the gaps (A, B, C, and D) described above. However, the application of an adhesive requires a considerable amount of work, and it takes time for the adhesive to harden. This complicates the manufacturing process, resulting in increased take time. It has also been found that the adhesive may spread and adhere to wire bonding surfaces and solder bonding surfaces resulting in reduced product yield.

Another way to firmly secure the metal terminal 100 to the resin case 102, which is made of a thermoplastic resin, is to fuse the resin around the terminal 100 using heated metal pieces 112 as shown in FIG. 15. This causes the metal terminal 100 to be thermoplastically bonded and secured to the resin case 102. However, this method is disadvantageous in that since the metal terminal 100 is only partially bonded to the resin case 102, the securing force is insufficient. The temperature of the metal pieces 112 may be increased to more widely bond the metal terminal 100 to the resin case 102. However, this may cause the melting of unintended portions of the resin case 102, resulting in deformation and reduced strength. Furthermore, molten resin material may adhere to the wire bonding surface and solder bonding surface of the metal terminal 100 resulting in reduced product yield.

SUMMARY OF THE INVENTION

The present invention has been devised to solve the above problems. It is, therefore, an object of the present invention to provide a semiconductor device in which metal terminals are firmly bonded and secured to the resin case in a simple manner without any trouble so that these metal terminals are properly wire bonded to the semiconductor chip in the resin case. Another object of the present invention is to provide a method for manufacturing such a semiconductor device.

According to one aspect of the present invention, a semiconductor device includes a thermoplastic resin case, a semiconductor chip mounted within said thermoplastic resin case, a metal terminal having a wire bonding surface and an opposing contact surface, and a wire connected between said wire bonding surface and said semiconductor chip. Said contact surface of said metal terminal is thermoplastically bonded at an area to the inside of said thermoplastic resin case.

According to another aspect of the present invention, a method for manufacturing a semiconductor device includes the steps of a terminal mounting step of mounting a metal terminal on a thermoplastic resin case at a predetermined location such that a portion of said metal terminal is in contact with said thermoplastic resin case, a thermoplastic bonding step of heating said mounted metal terminal by induction heating to a temperature higher than the melting point of said thermoplastic resin case so that said portion of said metal terminal is thermoplastically bonded to said thermoplastic resin case, a chip mounting step of mounting a semiconductor chip within said thermoplastic resin case, and a wire bonding step of connecting said bonded metal terminal to said semiconductor chip by wire bonding.

Other and further objects, features and advantages of the invention will appear more fully from the following description.

DETAILED DESCRIPTION OF THE PREFERRED EMBODIMENT

Embodiment

Figure 1:
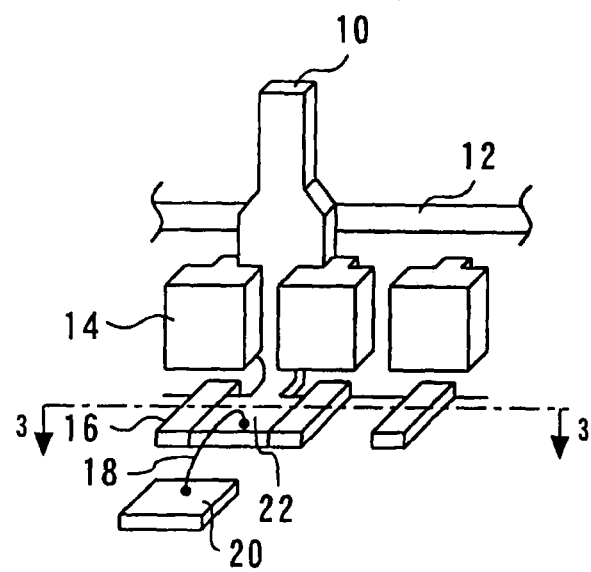
FIG. 1 shows the configuration of the semiconductor device of the embodiment.
Figure 2:
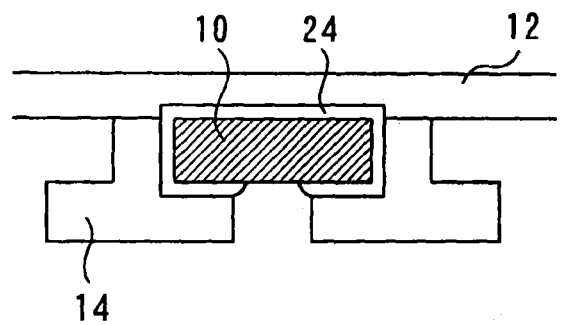
FIG. 2 is a plan view of the view of FIG. 1.

This embodiment of the present invention relates to a semiconductor device in which metal terminals "outserted" into the exterior resin case are wire bonded to the semiconductor chip mounted within the resin case. This embodiment also relates to a method for manufacturing such a semiconductor device. The configuration of the semiconductor device of the present embodiment will be described with reference to FIG. 1. This semiconductor device includes an exterior resin case 12 (of a thermoplastic resin) having protrusions 14 on its inner sidewalls. Each protrusion 14 is of a T shape whose stem portion projects perpendicularly from a respective inner sidewall of the resin case 12, as shown in FIGS. 1 and 2. The resin case 12 also includes low protrusions which are referred to herein as "wire-bonding-surface holding portions 16." Each pair of wire-bonding-surface holding portions 16 form therebetween a groove in which the wire bonding surface (described later) of a metal terminal 10 is secured.

Each metal terminal 10 is secured to the resin case 12 described above and has a wire bonding surface 22 to which a wire 18 is wire bonded. Specifically, as shown in FIG. 1, the metal terminal 10 has the following three portions: an external connection portion extending outwardly from the resin case 12; an engaging portion for engaging between a pair of protrusions 14; and a wire bonding portion having the wire bonding surface 22.

One end of the wire 18 is connected to the wire bonding surface 22, and the other end is connected to a predetermined point on a semiconductor chip 20 mounted within the resin case 12, thus allowing the semiconductor chip 20 to be electrically connected to an external device through the wire 18 and the metal terminal 10.

FIG. 2 is a plan view of the view of FIG. 1. As shown in FIG. 2, a solidified molten resin portion 24 is provided at the interface between the engaging portion of the metal terminal 10 and the resin case 12 to thermoplastically bond and secure the engaging portion of the terminal 10 to the resin case 12. Specifically, the solidified molten resin portion 24 is formed as a result of melting and cooling the portion of the resin case 12 in contact with the engaging portion of the metal terminal 10.

Figure 3:
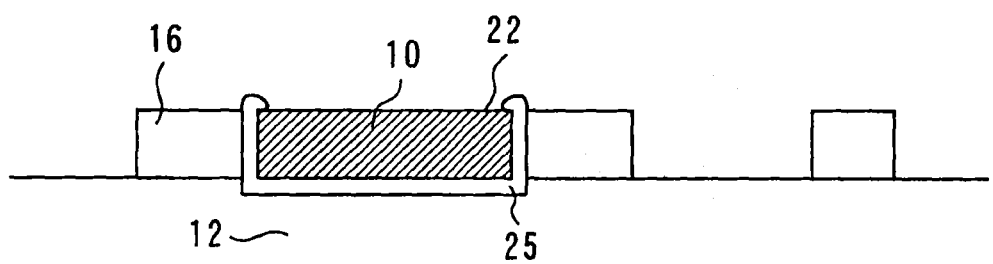
FIG. 3 is a cross-sectional view taken along line 3-3 of FIG. 1.

FIG. 3 is a cross-sectional view taken along line 3-3 of FIG. 1. FIG. 3 shows a solidified molten resin portion 25 provided at the interface between the wire bonding portion of the metal terminal 10 and the wire-bonding-surface holding portion 16, etc. of the resin case 12 to thermoplastically bond and secure the wire bonding portion of the terminal 10 to the resin case 12. Like the solidified molten resin portion 24, the solidified molten resin portion 25 is formed as a result of melting and cooling the portion of the resin case 12 in contact with the wire bonding portion of the metal terminal 10. This completes the description of the configuration of the semiconductor device of the present embodiment. A method for manufacturing this semiconductor device will now be described with reference to the flowchart shown in FIG. 4.

Figure 5:
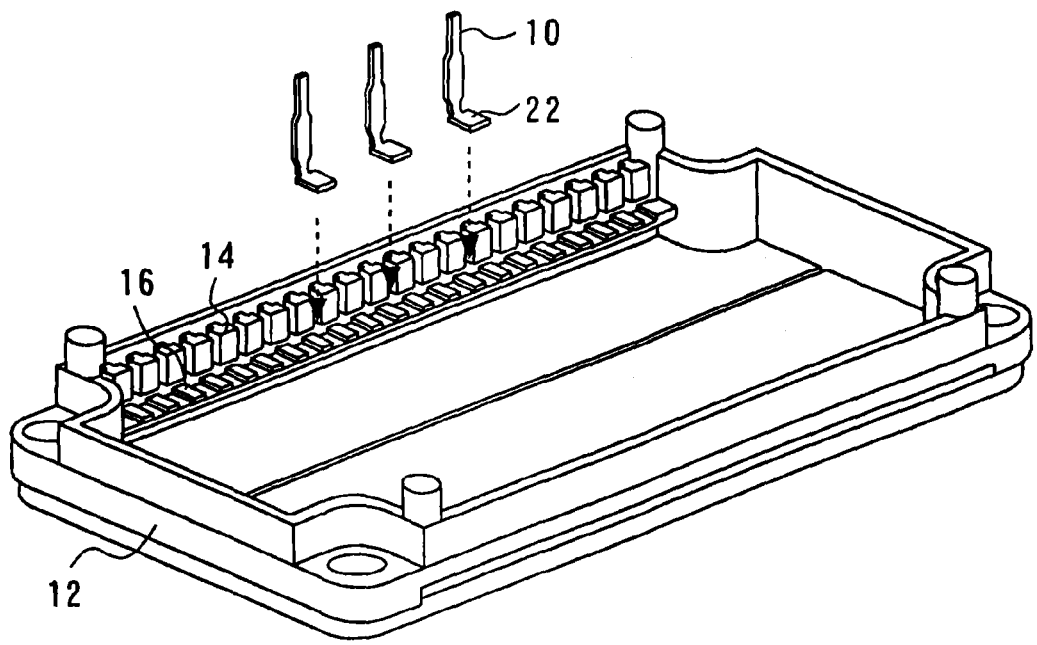
FIG. 5 shows the insert direction of metal terminal.

First, metal terminals 10 are inserted into the molded resin case 12 (of a thermoplastic resin) at step 30. This step will be described with reference to FIG. 5. As shown in FIG. 5, the metal terminals 10 are inserted into the resin case 12 in the direction indicated by the arrows. It should be noted that in all the accompanying figures, components common to FIG. 1 are designated by the same reference numerals. As a result of step 30, the engaging portion of each metal terminal 10 is engaged between a respective pair of protrusions 14 of the molded resin case 12, and the wire bonding portion of each metal terminal 10 is engaged between a respective pair of wire-bonding-surface holding portions 16.

Figure 6:
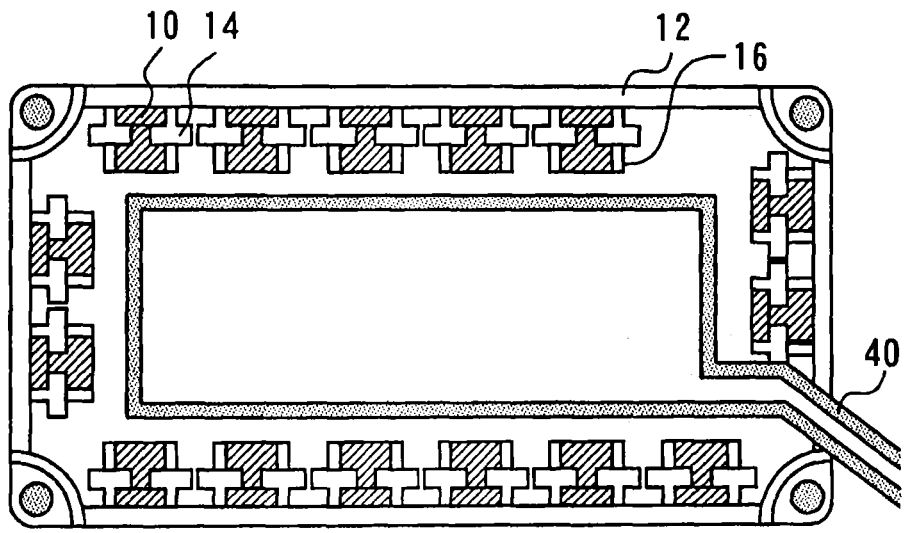
FIG. 6 is a diagram that shows AC magnetic field generator placed within the resin case.

The manufacturing method then proceeds to step 32. At step 32, an AC magnetic field generator 40 is placed within the resin case 12. This step will be described with reference to FIG. 6. The AC magnetic field generator 40 has a conductor and is adapted to pass an AC current through this conductor to generate a magnetic field around it. Specifically, the AC magnetic field generator 40 has a conductor including a rectangular loop portion. This rectangular loop conductor portion of the AC magnetic field generator 40 is sized such that it can be placed as close to the inner sidewalls of the resin case 12 as possible without contacting the metal terminals 10.

Figure 12:
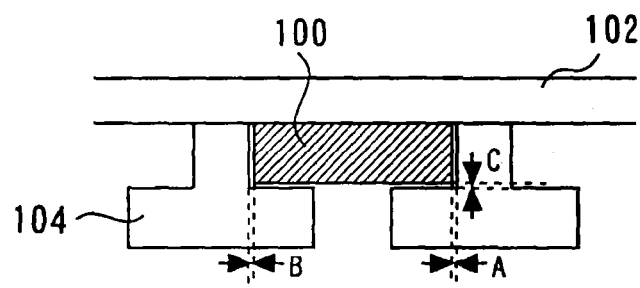
FIG. 12 is a cross-sectional view taken along line 12-12 of FIG. 11.
Figure 13:
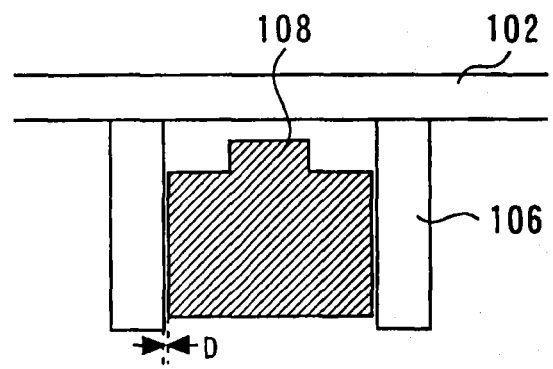
FIG. 13 is a plan view of the view of FIG. 11.
Figure 14:
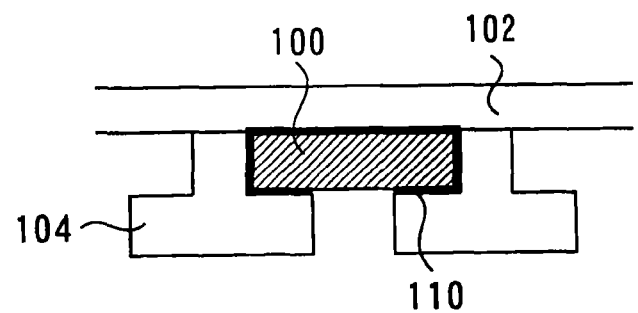
FIG. 14 is a diagram view of the same cross section as FIG. 12 which uses adhesive.
Figure 15:
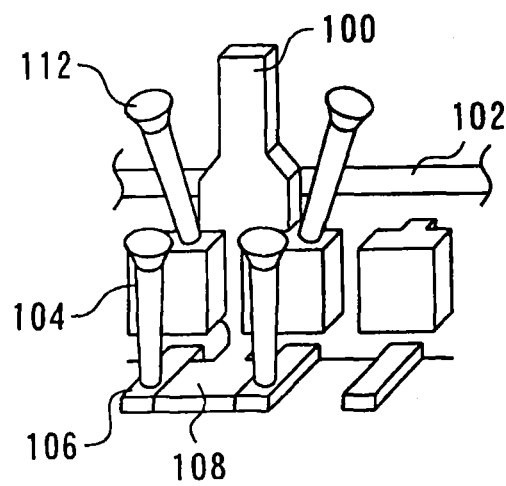
FIG. 15 shows another way to fuse the resin.

The manufacturing method then proceeds to step 34. At step 34, the rectangular loop conductor portion of the AC magnetic field generator 40 placed within the resin case 12 is caused to generate a time-varying magnetic field, which induces an eddy current in the magnetic terminals 10 (i.e., electromagnetic induction). According to the present embodiment, the AC magnetic field generator 40 applies a current at a frequency of approximately 300 kHz to the conductor for approximately 10 seconds to induce a current of approximately 500-600 A in the metal terminals 10. As a result, the metal terminals 10 are heated to approximately 300° C., thereby melting the portions of the resin case 12 in contact with the metal terminals 10. It should be noted that there may be gaps between the metal terminals 10 and the resin case 12, such as the gaps A, B, C, and D described with reference to FIGS. 12 and 13. However, even in such a case, the metal terminals 10 and the resin case 12 are sufficiently close to each other so that the portions of the resin case 12 in contact with or adjacent to the metal terminals 10 melt when the terminals are heated as described above.

Then, at step 36, the AC magnetic field generator 40 is retrieved from within the resin case 12.

The manufacturing method then proceeds to step 38. At step 38, a semiconductor chip is mounted on the inner bottom of the resin case 12 in the same manner as the semiconductor chip 20 shown in FIG. 1. It should be noted that the semiconductor chip may be placed at any position that allows wire bonding on the chip as described later.

The manufacturing method then proceeds to step 40. At step 40, the wire bonding surface 22 of each metal terminal 10 is wire bonded to the semiconductor chip 20.

When each metal terminal is wire bonded to the semiconductor chip, the wire is bonded to the metal terminal while applying heat, ultrasonic wave energy, and pressure to the terminal. Successful formation of a sufficient amount of alloy between the wire and the metal terminal requires that ultrasonic vibration be properly applied to the metal terminal when the wire is bonded to the terminal. However, in the case of conventional semiconductor devices, it frequently happens that "outserting" a metal terminal into the resin case does not result in sufficient securing force being applied to the terminal. This may lead to the capillary (or tip) of the wire bonding apparatus moving in response to displacement of the metal terminal, thereby preventing proper application of ultrasonic vibration to the terminal. It has been found that as a result, the wire cannot be bonded to the metal terminal, or the bonding strength is not sufficient.

The present embodiment solves the above problems. According to the present embodiment, solidified molten resin portions are provided at a plurality of interfaces between each metal terminal and the resin case to thermoplastically bond and secure the metal terminal to the resin case, as described with reference to FIGS. 2 and 3. That is, with the solidified molten resin portions, the metal terminal is bonded to the resin case at these interface areas, resulting in the metal terminal being firmly secured to the resin case. This ensures that the metal terminal is not displaced by the wire bonding operation, thereby allowing a sufficient amount of alloy to be accurately formed between the wire and the metal terminal. It was found that the bonding strength between the metal terminal and the resin case was approximately 30-40 N when they were bonded together by the application of heat as described above with reference to FIG. 15, and 80-100 N when they are bonded together by the bonding method of the present embodiment. Thus, according to the present embodiment, each metal terminal can be securely fixed to the resin case.

Figure 4:
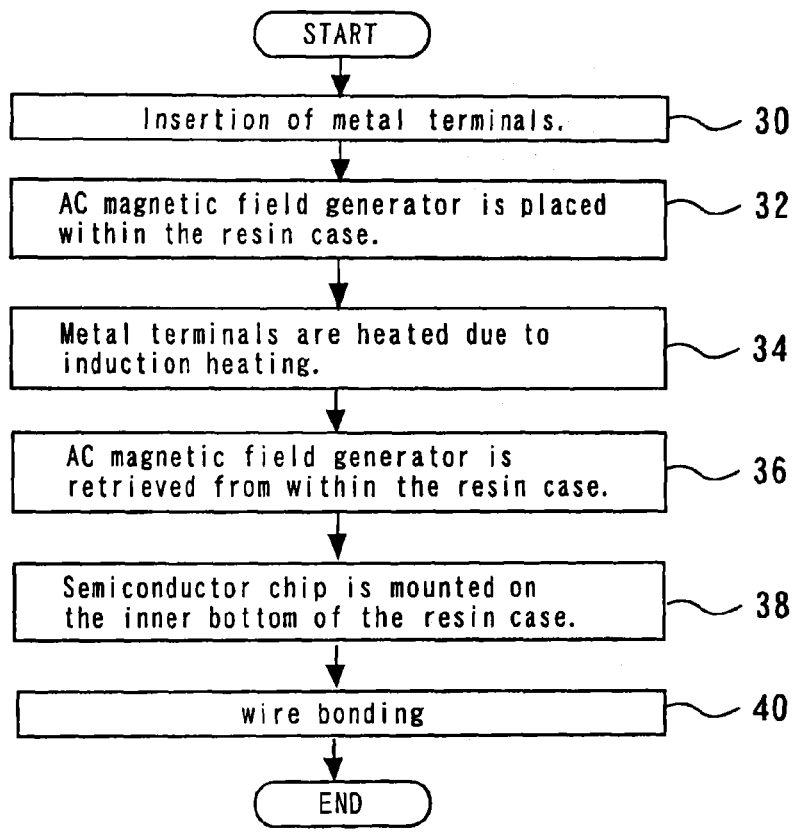
FIG. 4 is a flowchart that shows a method for manufacturing semiconductor device.

Further, the present embodiment is characterized in that the metal terminals themselves are inductively heated to thermoplastically bond them to the resin case of a thermoplastic resin as described with reference to the flowchart of FIG. 4. Induction heating allows the metal terminals to be heated without making any contact with them, meaning that the terminals can be secured at precisely controlled positions. On the other hand, if the metal terminals are heated by pressing heated metal pieces to them, the metal terminals may be displaced from their desired positions. The heating method of the present embodiment does not present this problem, since the metal terminals are heated without contacting them.

Further, since the metal terminals are inductively heated by an AC magnetic field generator placed within the resin case, the AC magnetic field generator can be closely spaced from the metal terminals, allowing effective heating of the terminals. When inductively heating these terminals, the AC magnetic field generator can be set close to the wire bonding portions of the metal terminals, as compared to the case where the AC magnetic field generator is placed outside the resin case. Therefore, an appropriate solidified molten resin portion can be formed at the interface between the wire bonding portion of each metal terminal and the resin case to thermoplastically bond and secure the wire bonding portion of the terminal to the resin case at this interface area. This ensures proper application of ultrasonic vibration to each metal terminal when a wire is wire bonded to the terminal. Thus, the present embodiment allows reliable and accurate wire bonding on each metal terminal with increased bonding strength between the wire and the terminal.

The metal terminal securing method of the present embodiment has an advantage over the use of an adhesive in that it can be implemented by a simpler process and that there is no fear of scattering of adhesive and resulting defects. Further, this method allows the metal terminals to be effectively and reliably bonded to the resin case, as compared to the case where heated metal pieces are pressed against the resin case to melt specific portions of the resin case. Specifically, pressing heated metal pieces against the resin case may cause the melting of unintended portions of the resin case (i.e., portions of the resin case that are not related to the bonding between the metal terminals and the resin case), resulting in deformation and reduced strength. On the other hand, the method of the present embodiment for manufacturing a semiconductor device can effectively and reliably bond the metal terminals to the resin case, since the bonding is carried out in such a way as to avoid melting the portions of the resin case that are not related to the bonding.

Figure 7:
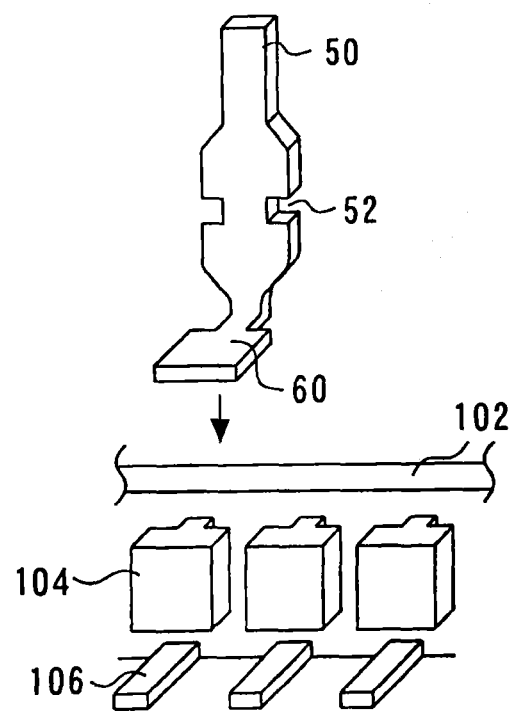
FIG. 7 shows one example of the configuration of metal terminal.

It should be noted that each metal terminal may have the configuration shown in FIG. 7 to further increase the bonding strength between the metal terminal and the resin case. The metal terminal 50 shown in FIG. 7 includes an external connection portion, an engaging portion, and a wire bonding portion, like the metal terminals 10 described above. However, the metal terminal 50 is characterized in that it has notches, or concave portions, 52 in its engaging portion. Referring to FIG. 7, in the manufacture of this semiconductor device, the metal terminal 50 (having the notches 52) is inserted into a resin case 102 in the direction indicated by the arrow. The remaining process steps are the same as those previously described with reference to the flowchart of FIG. 4.

Figure 8:
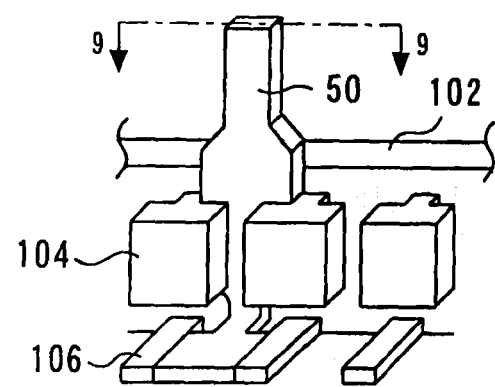
FIG. 8 shows the metal terminal and adjacent structures of the resin case after the terminal has been inserted into the resin case and after induction heating has been applied to the terminal.
Figure 9:
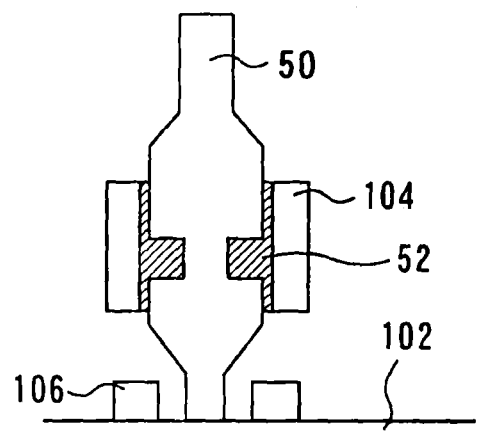
FIG. 9 is a cross-sectional view taken along line 9-9 of FIG. 8.
Figure 10:
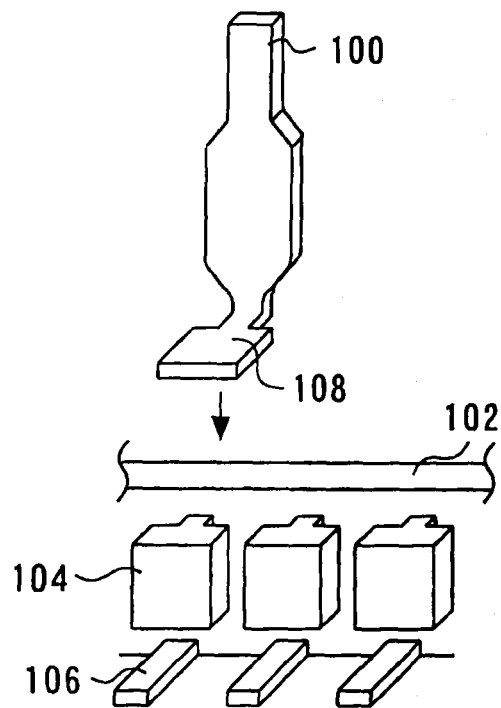
FIG. 10 is a diagram explaining metal terminal insertion regarding related art.
Figure 11:
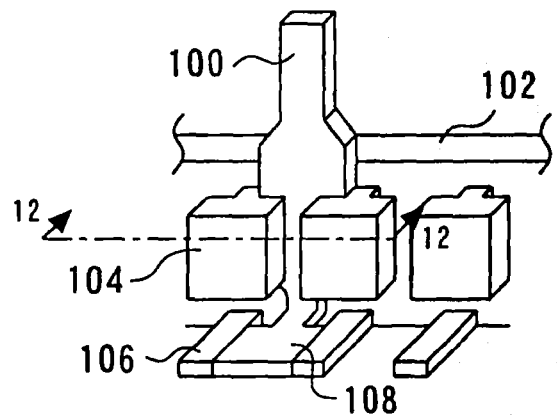
FIG. 11 shows the metal terminal that has been inserted and engaged between the protrusions.

FIG. 8 shows the metal terminal 50 and adjacent structures of the resin case 102 after the terminal has been inserted into the resin case 102 and after induction heating has been applied to the terminal. FIG. 9 is a cross-sectional view taken along line 9-9 of FIG. 8. As shown in FIG. 9, the induction heating (and subsequent cooling) forms a solidified molten resin portion along the edges of the notches 52. Thus, the metal terminal 50 having the notches 52 has more bonding areas than a metal terminal having no notches. This means that the metal terminal 50 can be more firmly secured to the resin case.

Thus, according to the present invention, the metal terminals are firmly secured to the resin case since they are bonded at large areas to the case. This allows for reliable and accurate wire bonding on each metal terminal, thereby firmly bonding the wire to the terminal. This feature contributes to extending the useful life, reducing the power consumption, and increasing the production yield of the semiconductor device. Further, the metal terminals are bonded to the resin case by induction heating, thus simplifying the manufacturing process. It should be noted that since this semiconductor device is manufactured without using adhesive, it is easy to separate the device into individual components and retain or destroy them at the time of disposal.

According to the present embodiment, the AC magnetic field generator has a conductor including a rectangular loop portion, and this loop portion is placed within the resin case to generate a magnetic field for induction heating. With this arrangement, the metal terminals can be effectively bonded to the resin case by induction heating, since the AC magnetic field generating source, i.e., the rectangular loop conductor portion, is set within the resin case. It should be understood, however, that the present invention is not limited to this particular arrangement, and the AC magnetic field generating source may be placed outside the resin case if sufficient induction heating is ensured. Further, in either case, the rectangular loop portion of the conductor of the AC magnetic field generator may be omitted while retaining advantages of the present invention.

Further, the step 38 of mounting a semiconductor chip described with reference to FIG. 4 may be performed at any time before the step 40 of wire bonding.

Thus, the present invention allows a semiconductor device to be manufactured in such a way that metal terminals are firmly bonded and secured to its exterior resin case in a simple manner so that these metal terminals can be properly wire bonded to the semiconductor chip in the resin case.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-046390, filed on Feb. 27, 2008 including specification, claims, drawings and summary, on which the Convention priority of the present application is based, are incorporated herein by reference in its entirety.

What is claimed is:

1. A method for manufacturing a semiconductor device, comprising:

mounting a metal terminal on a thermoplastic resin case at a predetermined location such that a portion of said metal terminal is in contact with said thermoplastic resin case;

heating said mounted metal terminal by induction heating to a temperature higher than the melting point of said thermoplastic resin case so that said portion of said metal terminal is thermoplastically bonded to said thermoplastic resin case;

mounting a semiconductor chip within said thermoplastic resin case; and connecting said bonded metal terminal to said semiconductor chip by wire bonding, wherein said metal terminal has a wire bonding surface and an opposing contact surface, said portion of said metal terminal thermoplastically bonded to said thermoplastic resin case including the opposing contact surface of said metal terminal.

2. The method as claimed in claim 1, wherein:

said wire bonding includes wire bonding on said wire bonding surface of said metal terminal; and said thermoplastic bonding includes:

placing an AC magnetic field generator within said thermoplastic resin case; and thermoplastically bonding said opposing contact surface of said metal terminal to an inner bottom of said thermoplastic resin case by induction heating using said AC magnetic field generator.

3. The method as claimed in claim 1, wherein:

said metal terminal has a concave portion; and said thermoplastic bonding is performed in such a manner that a solidified molten portion of said thermoplastic resin case fills said concave portion.

4. The method as claimed in claim 1, wherein said metal terminal has a first engagement portion in the form of a first recessed notch and a second engagement portion in the form of a second recessed notch.

5. The method as claimed in claim 1, wherein said thermoplastic resin case has a sidewall with a plurality of protrusions, each said protrusion having a T-shaped cross-section as seen from a direction perpendicular to a bottom portion of said thermoplastic resin case.

6. The method as claimed in claim 1, wherein said metal terminal is sandwiched between two protrusions extending from a sidewall of said thermoplastic resin case such that a first engagement portion of said metal terminal in the form of a first recessed notch and a second engagement portion of said metal terminal in the form of a second recessed notch are between the two protrusions in a side view.

* * * * *